US011139787B2

(12) United States Patent
Bronzi

(10) Patent No.: US 11,139,787 B2
(45) Date of Patent: Oct. 5, 2021

(54) ELECTRICAL AMPLIFIER

(71) Applicant: Sicoya GmbH, Berlin (DE)

(72) Inventor: Danilo Bronzi, Berlin (DE)

(73) Assignee: SICOYA GMBH, Berlin (DE)

( * ) Notice: Subject to any disclaimer, the term of this patent is extended or adjusted under 35 U.S.C. 154(b) by 20 days.

(21) Appl. No.: 16/711,635

(22) Filed: Dec. 12, 2019

(65) Prior Publication Data

US 2021/0184639 A1 Jun. 17, 2021

(51) Int. Cl.
*H03F 3/45* (2006.01)
*H03F 1/02* (2006.01)
*H03F 1/30* (2006.01)
*H03F 1/32* (2006.01)
*H03F 1/42* (2006.01)

(52) U.S. Cl.
CPC ....... *H03F 3/45076* (2013.01); *H03F 1/0205* (2013.01); *H03F 1/302* (2013.01); *H03F 1/307* (2013.01); *H03F 1/3211* (2013.01); *H03F 1/42* (2013.01); *H03F 2203/45034* (2013.01); *H03F 2203/45112* (2013.01); *H03F 2203/45116* (2013.01); *H03F 2203/45154* (2013.01)

(58) Field of Classification Search
CPC .................................................. H03F 3/4507
See application file for complete search history.

(56) References Cited

U.S. PATENT DOCUMENTS

| | | | |
|---|---|---|---|
| 5,434,880 A * | 7/1995 | Burrows | H01S 3/092 372/69 |
| 6,707,589 B2 | 3/2004 | Bostak et al. | |
| 8,963,641 B1 * | 2/2015 | Liu | H03F 3/45475 330/261 |
| 9,614,697 B2 * | 4/2017 | Chang | H04L 27/01 |
| 10,425,042 B2 * | 9/2019 | Xavier | H03F 1/301 |
| 2006/0261902 A1 * | 11/2006 | Masuda | H03B 5/1243 331/36 C |
| 2014/0253236 A1 * | 9/2014 | Cheeranthodi | H03F 3/45179 330/260 |

(Continued)

FOREIGN PATENT DOCUMENTS

CN 104617483 A 5/2015
EP 0 689 283 A1 12/1995

OTHER PUBLICATIONS

Behnam Sedighi et al.; "Low Power 20-Gbs SiGe BiCMOS Driver with 2.5 V Output Swing", IEEE International Microwave Symposium Digest (2012).

(Continued)

*Primary Examiner* — Patricia T Nguyen
(74) *Attorney, Agent, or Firm* — Gordon Rees Scully Mansukhani, LLP

(57) ABSTRACT

An exemplary embodiment of the invention relates to an electrical amplifier comprising a differential preamplifier having a first output port and a second output port; and a downstream amplifier stage having a first output unit and a second output unit; wherein the first output unit is connected to the first output port of the differential preamplifier and the second output unit is connected to the second output port of the differential preamplifier; and wherein a negative impedance converter is electrically located in at least one of said differential preamplifier and said downstream amplifier stage.

16 Claims, 9 Drawing Sheets

(56) References Cited

U.S. PATENT DOCUMENTS

2014/0306737 A1* 10/2014 Mukherjee .......... H03F 3/45094
                                                      327/108
2020/0313638 A1* 10/2020 Hong ................ H03F 3/45183

OTHER PUBLICATIONS

Iria Garcia Lopez et al.; "High speed BiCMOS linear driver core for segmented InP Mach-Zehnder modulators"; Analog Integr Circ Sig Process; vol. 87; pp. 105-115; (2016).

Sudip Shekhar et al.; "Bandwidth Extension Techniques for CMOS Amplifiers"; IEEE Journal of Solid-State Circuits; vol. 41, No. 11; Nov. 2006; pp. 2424-2439.

Enrico Temporiti et al.; "Insights into Silicon Photonics Mach-Zehnder-Based Optical Transmitter Architectures"; IEEE Journal of Solid-State Circuits, vol. 51, No. 12; Dec. 2016; pp. 3178-3191.

Sherif Galal et al.; "10-Gb/s Limiting Amplifier and Laser/Modulator Driver in 0.18-/spl mu/m CMOS Technology"; IEEE Journal of Solid-State Circuits, IEEE USA; vol. 38; No. 12; Dec. 12, 2003; pp. 2138-2146.

Piotr Kaczmarczyk et al; "Continuous-Time Discriminator Design in CMOS 28 nm Process"; 2019—MIDES Proceedings of the 26th International Conference; "Mixed Design of Integrated Circuits and Systems"; Jun. 27-29, 2019; Department of Microelectronics & Computer Science; LODZ University of Technology; pp. 186-189; XP033590729.

Behzad Razavi "The Cross-Coupled Pair—Part III"; A Circuit for All Seasons; IEEE Solid-State Circuits Magazine; Winter 2015; IEEE Advanced Technology for Humanity; vol. 7; No. 1; Feb. 11, 2015; pp. 10-13; XP011572840.

International Search Report and Written Opinion dated Mar. 12, 2021 issued in related International PCT Application No. PCT/EP2020/084312; filed Dec. 2, 2020.

* cited by examiner

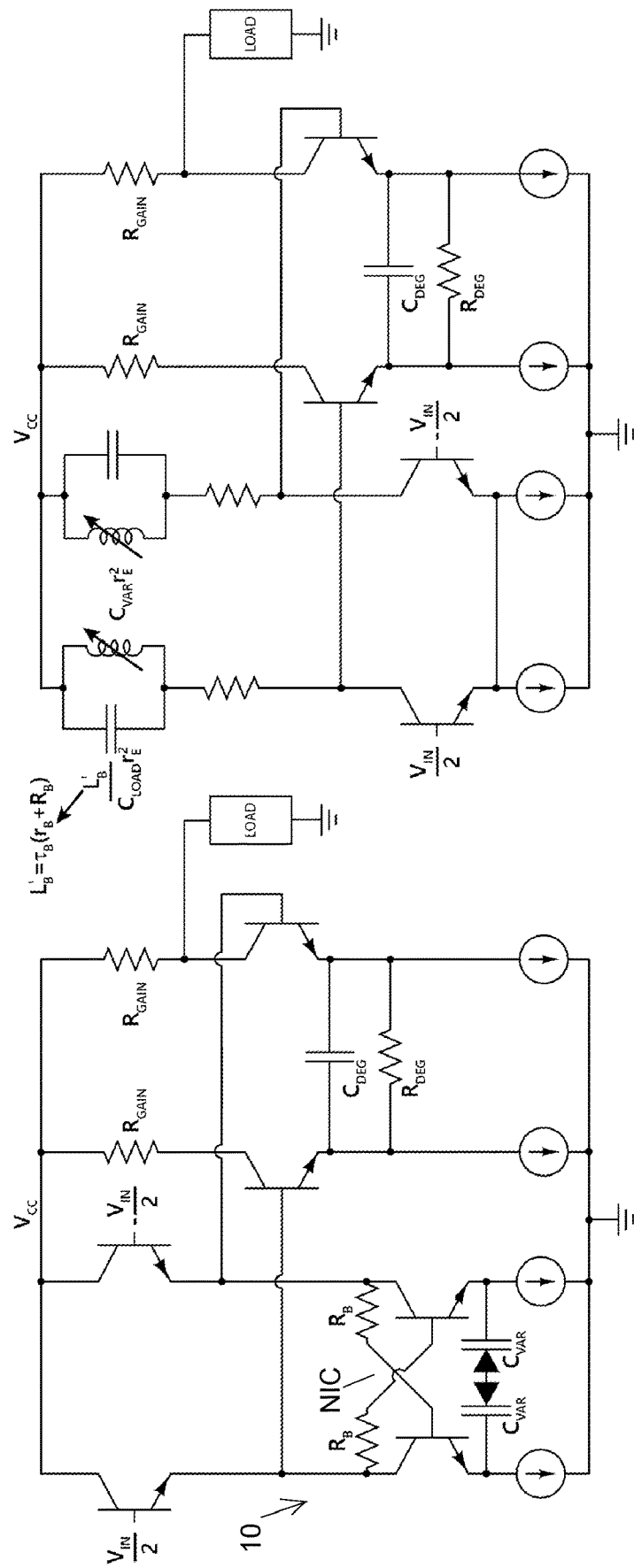

ELECTRICAL AMPLIFIER

The invention relates to electrical amplifiers as well as devices that comprise electrical amplifiers and modulators.

BACKGROUND OF THE INVENTION

Fast analog drivers are critical components in high-speed optical transceivers; nonetheless, with increasing data rates beyond 40 Gb/s, it has become increasingly difficult to realize low-power amplifiers and driving circuits with high bandwidth. This problem is further exacerbated by the optical modulators that require large driving currents or large voltage swing to achieve the necessary speed, which, in turn, entails either large output buffers or large gain stages, both of which resulting in higher power consumption and decreased bandwidth.

Several equalization techniques can be employed to extend the bandwidth of the optical modulator, such as feed-forward equalization (hereinafter referred to as FFE approach) or continuous-time linear equalization (hereinafter referred to as CTLE approach), with the latter being less power-hungry; whereas, negative miller capacitance (hereinafter referred to as NMC approach) or inductive peaking are generally used to cancel out the parasitic capacitance of large transistors, as shown in the Chinese patent application CN104617483 and the paper by S. Sedighi et al. entitled "Low-Power 20-Gbs SiGe BiCMOS Driver with 2.5 V Output Swing" IEEE International Microwave Symposium Digest (2012).

The main disadvantage of using the FFE approach and the CTLE approach is that both reduce the low-frequency gain, thus bandwidth enhancement comes at the expense of the electro-optical effect. Regarding the inductive peaking, on-chip inductors may consume a large amount of area, increasing the cost of the chip, and may couple to other sensitive parts of the circuitry; therefore, inductor-less circuits might be desirable. In this respect, a better approach is the negative miller capacitance (NMC), where two additional cross-connected capacitors are used to neutralize the parasitic base-collector capacitance of the transistors. Since the NMC is based on a positive feedback created by the cross-connected capacitors, stability however is always an issue. Moreover, the bandwidth enhancement obtained decreases for higher values of emitter degeneration resistance, since the miller effect is reduced.

Objective of the Present Invention

In view of the above, an objective of the present invention is to provide an improved electrical amplifier.

Another objective of the present invention is to provide an improved device that comprises at least one electrical amplifier and at least one modulator.

BRIEF SUMMARY OF THE INVENTION

An exemplary embodiment of the present invention relates to an electrical amplifier comprising a differential preamplifier having a first output port and a second output port; and a downstream amplifier stage having a first output unit and a second output unit; wherein the first output unit is connected to the first output port of the differential preamplifier and the second output unit is connected to the second output port of the differential preamplifier; and wherein a negative impedance converter is electrically located in at least one of said differential preamplifier and said downstream amplifier stage.

The above exemplary embodiment of the invention may provide a large bandwidth and reduced stability issues. The basic idea is to use a negative capacitance that may neutralize not only the parasitic capacitance of the transistors of the preamplifier but also the load capacitance of the subsequent downstream amplifier stage.

The negative impedance converter is preferably configured to provide a negative capacitance.

The negative impedance converter may be electrically located in the differential preamplifier and may apply the negative capacitance to the first output port and the second output port of the differential preamplifier.

The differential preamplifier preferably comprises a first and a second transistor.

The emitter of the first transistor may provide the first output port of the differential preamplifier.

The emitter of the second transistor may provide the second output port of the differential preamplifier.

The negative impedance converter preferably applies the negative capacitance to the emitters of the first and second transistor.

The collector of a third transistor may be connected to the base of a fourth transistor.

The collector of the fourth transistor may be connected to the base of the third transistor.

At least one capacitor preferably connects the emitters of the third transistor and fourth transistor.

The third transistor, the fourth transistor and the at least one capacitor preferably form or are at least part of said negative impedance converter.

The emitter of the first transistor is preferably connected to both the collector of the third transistor and the base of the fourth transistor. The emitter of the second transistor is preferably connected to both the collector of the fourth transistor and the base of the third transistor.

The base of the first transistor may form a first input port of the differential preamplifier.

The base of the second transistor may form a second input port of the differential preamplifier.

Emitters of the third transistor and fourth transistor are preferably connected by a first capacitor and a second capacitor.

The first and the second capacitor are preferably connected in series.

The first and the second capacitor may be variable.

The emitter of the first transistor may be connected to the base of the fourth transistor via a first resistance.

The emitter of the second transistor may be connected to the base of the third transistor via a second resistance.

Alternatively or additionally, the negative impedance converter may be electrically located in the downstream amplifier stage and may apply the negative capacitance to the downstream amplifier stage.

In the latter embodiment, the downstream amplifier may comprise a first and a second transistor.

The emitter of at least one of the first and second transistor (of the downstream amplifier stage) preferably provides an output port of the downstream amplifier.

The negative impedance converter preferably couples the emitters of the first and second transistor of the downstream amplifier stage and applies the negative capacitance to the emitters of the first and second transistor.

The collector of a third transistor (of the downstream amplifier stage) is preferably connected to the base of a fourth transistor (of the downstream amplifier stage).

The collector of the fourth transistor is preferably connected to the base of the third transistor.

At least one capacitor (of the downstream amplifier stage) preferably connects the emitters of the third transistor and fourth transistor.

The third transistor, the fourth transistor and the at least one capacitor preferably form or are at least part of said negative impedance converter of the downstream amplifier stage.

The emitter of the first transistor is preferably connected to both the collector of the third transistor and the base of the fourth transistor.

The emitter of the second transistor is preferably connected to both the collector of the fourth transistor and the base of the third transistor.

The emitter of the first transistor is preferably connected to the base of the fourth transistor via a first resistance.

The emitter of the second transistor is preferably connected to the base of the third transistor via a second resistance.

The bases of the third and fourth transistor are preferably connected via a third resistance.

The emitter of the first transistor may be connected to the base of the fourth transistor via a first auxiliary capacitor. The emitter of the second transistor may be connected to the base of the third transistor via a second auxiliary capacitor.

The bases of the third and fourth transistor are preferably connected via a third resistance and fourth resistance.

The third resistance and the fourth resistance are preferably connected in series.

The midpoint between the third resistance and fourth resistance is preferably connected to a voltage source that determines the current through the third and fourth transistor.

The emitters of the third and fourth transistor are preferably grounded via resistors.

The base of the first transistor may form a first input port of the downstream amplifier stage.

The base of the second transistor may form a second input port of the downstream amplifier stage.

Said negative impedance converter may comprise a first capacitor and a second capacitor. The first and the second capacitor are preferably connected in series. The first and the second capacitor are preferably variable.

The amplifier may comprise at least two differential preamplifiers.

A negative impedance converter is preferably located in both of said at least two differential preamplifiers.

The negative impedance converters are preferably each configured to provide a negative capacitance.

Each of the negative impedance converters may apply its negative capacitance to both output ports of the allocated differential preamplifier.

In all configurations described above, the amplifier may comprise a single output port for driving a load in a single-ended configuration.

Alternatively or additionally, the amplifier may comprise two output ports for driving a load differentially.

Another embodiment of the present invention relates to a device comprising at least one electrical amplifier having a negative impedance converter, and at least one modulator that is driven by said at least one amplifier.

The amplifier may drive the modulator in a push-pull mode.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which FIG. 5 illustrates a third exemplary embodiment of an amplifier and a device according to the present invention, FIG. 6 illustrates the equivalent circuit of the third exemplary embodiment.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
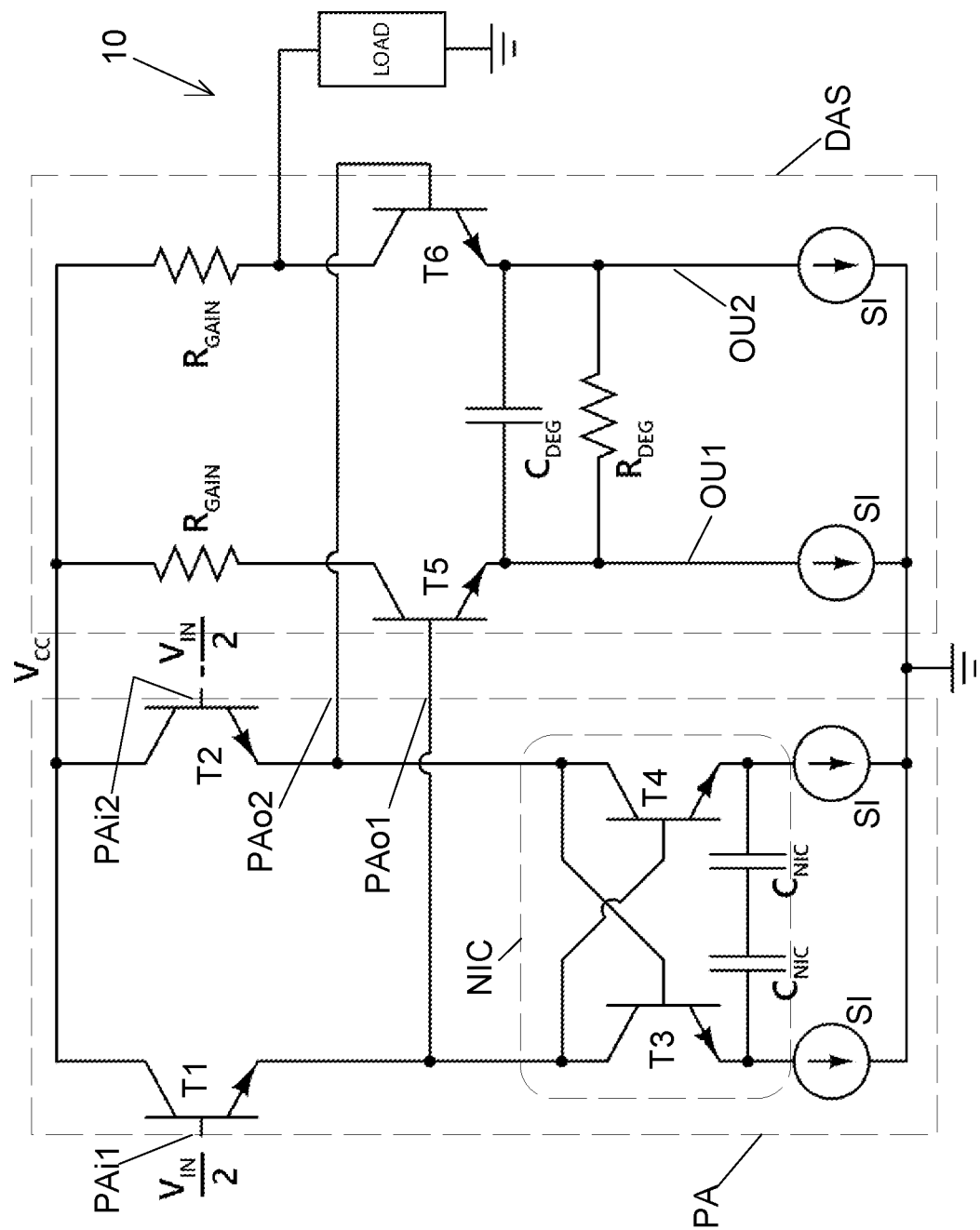
FIG. 1 illustrates a first exemplary embodiment of an amplifier and a device according to the present invention.

FIG. 1 shows a first embodiment of an electrical amplifier 10 according to the present invention which is provided with a supply voltage $V_{cc}$.

The amplifier 10 comprises a differential preamplifier PA having a first output port PAo1 and a second output port PAo2.

A downstream amplifier stage DAS comprises a first output unit OU1 and a second output unit OU2. The first output unit OU1 is connected to the first output port PAo1 of the differential preamplifier PA and the second output unit OU2 is connected to the second output port PAo2 of the differential preamplifier PA.

A negative impedance converter NIC is electrically located in the differential preamplifier PA. The negative impedance converter NIC provides a negative capacitance and applies the negative capacitance to the first output port PAo1 and the second output port PAo2 of the differential preamplifier PA.

The differential preamplifier PA comprises a first and a second transistor T1 and T2. The emitter of the first transistor T1 provides the first output port PAo1 of the differential preamplifier PA. The emitter of the second transistor T2 provides the second output port PAo2 of the differential preamplifier PA. The negative impedance converter NIC applies the negative capacitance to the emitters of the first and second transistor T1 and T2.

The negative impedance converter NIC is formed by a third transistor T3, a fourth transistor T4 and capacitors $C_{NIC}$.

The collector of the third transistor T3 is connected to the base of the fourth transistor T4. The collector of the fourth transistor T4 is connected to the base of the third transistor T3. The emitters of the third transistor T3 and fourth transistor T4 are connected by the capacitors $C_{NIC}$ that are arranged in series.

In the exemplary embodiment of FIG. 1, the emitter of the first transistor T1 is connected to both the collector of the third transistor T3 and the base of the fourth transistor T4. The emitter of the second transistor T2 is connected to both the collector of the fourth transistor T4 and the base of the third transistor T3.

The base of the first transistor T1 forms a first input port PAi1 of the differential preamplifier PA. The base of the second transistor T2 forms a second input port PAi2 of the differential preamplifier PA. The input ports PAi1 and PAi2 are differentially provided with an input signal $V_{IN}$.

In the embodiment of FIG. 1, each of the output units OU1 and OU2 comprises a transistor T5/T6, a resistor $R_{GAIN}$ and a current source SI. The output units OU1 and OU2 are coupled by a capacitor $C_{DEG}$ and a resistor $R_{DEG}$.

The emitter of one of the transistors (here transistor T6) provides an output port of the downstream amplifier DAS to which a load LOAD is connected.

The exemplary embodiment described above with reference to FIG. 1 provides a large bandwidth without or with only insignificant stability issues. The basic idea is to use the negative capacitance of the negative impedance converter NIC that neutralizes not only the parasitic capacitance of the transistors T1 and T2 but also the entire load capacitance of the downstream amplifier stage DAS. Since the capacitors $C_{NIC}$ are placed across the two emitters of the cross-coupled transistors T3 and T4, the equivalent impedance $Z_{NIC}$ seen at the collector of the first transistor T3 is:

$$Z_{NIC}(s) = -\left(\frac{1}{sC_{NIC}} + r_e + sL_B\right), L_B = \tau_B r_B \qquad (1)$$

The variables in the above equation and the variables in the equations further below are defined in a separate list of formula symbols appended further below.

If we indicate with $C_{LOAD}$ the equivalent load capacitance of the downstream amplifier stage DAS, it is in principle possible to neutralize this capacitance by imposing $C_{NIC}=C_{LOAD}$.

The negative impedance converter NIC of FIG. 1 does not cause any significant power penalty. In the configuration shown in FIG. 1, the minimum voltage at the base of the transistor T1 is equal to the sum of the base-emitter voltage and the saturation voltage of the current mirror that is provided by the current sources SI. Therefore, it is possible to accommodate the negative impedance converter NIC above an emitter follower current mirror as shown in FIG. 1, without requiring additional voltage headroom, i.e. the power supply remains unchanged, as well as the overall power consumption. The overall transfer function of the amplifier of FIG. 1 is:

$$G_{OUT,NIC}(s) = -A \frac{(1+a_1 s)(1+b_1 s + b_2 s^2)}{1+c_1 s + c_2 s^2 + c_4 s^3 + c_4 s^4} \qquad (2)$$

$A = g_m R_{GAIN}$ $a_1 = -C_{BC}/g_m \; b_1 = C_{NIC} r_{e2} \; b_2 = C_{NIC} L_B$ $c_1 = C_{BE} r_{e1} + C_{BC} R_{GAIN} + C_{BC} r_{e1}(1+A) + C_{NIC}(r_{e2} - r_{e1})$ $c_2 = r_{e1} r_{e2} C_{BE} C_{NIC} + r_{e1} R_{GAIN} C_{BC} C_{BE} +$ $\qquad r_{e1} r_{e2} C_{BC} C_{NIC}(1+A) + R_{GAIN} C_{BC} C_{NIC}(r_{e2} - r_{e1}) + L_B C_{NIC}$ $c_3 = L_B C_{NIC}(C_{BE} r_{e1} + C_{BC} R_{GAIN}) +$ $\qquad r_{e1} C_{BC} C_{NIC} L_B(1+A) + r_{e1} r_{e2} R_{GAIN} C_{BE} C_{BC} C_{NIC}$ $c_4 = r_{e1} R_{GAIN} L_B C_{BE} C_{BC} C_{NIC}$ Stability is ensured, as long as $r_{e2} \geq r_{e1}$, since none of the coefficients will be negative. Assuming that the transistors T1 and T2 have the same size $r_e = r_{e1} = r_{e2}$ and considering that the pole determined by coefficient $C_4$ is at very high frequency, we can approximate equation (2) as:

$$G_{OUTNIC}(s) = -A(1+a_1 s)\frac{1+\frac{s}{m\omega_0}+\left(\frac{k_B}{m}\right)\frac{s^2}{\omega_0^2}}{1+\frac{s}{\omega_0}+\left(\frac{k_B+1}{m}\right)\frac{s^2}{\omega_0^2}+\left(\frac{k_B}{m}\right)\frac{s^3}{\omega_0^3}} \qquad (3)$$

$a_1 = \frac{-C_{BC}}{\beta_m}, m = \frac{C_{LOAD}}{C_{NIC}}, k_B = \frac{L_B/r_e^2}{C_{LOAD}}, \omega_0 = \frac{1}{C_{LOAD} r_e}$ $C_{LOAD} = C_{BE} + C_{BC} R_{GAIN}/r_e + C_{BC}(1+A)$ The frequency response of the amplifier 10 with the negative impedance converter NIC is:

$$G_{OUT,NMC}(s) = -A \frac{1+a_1 s}{1 \mid b_1 s \mid b_2 s^2} a_1 = \qquad (4)$$

Figure 2:
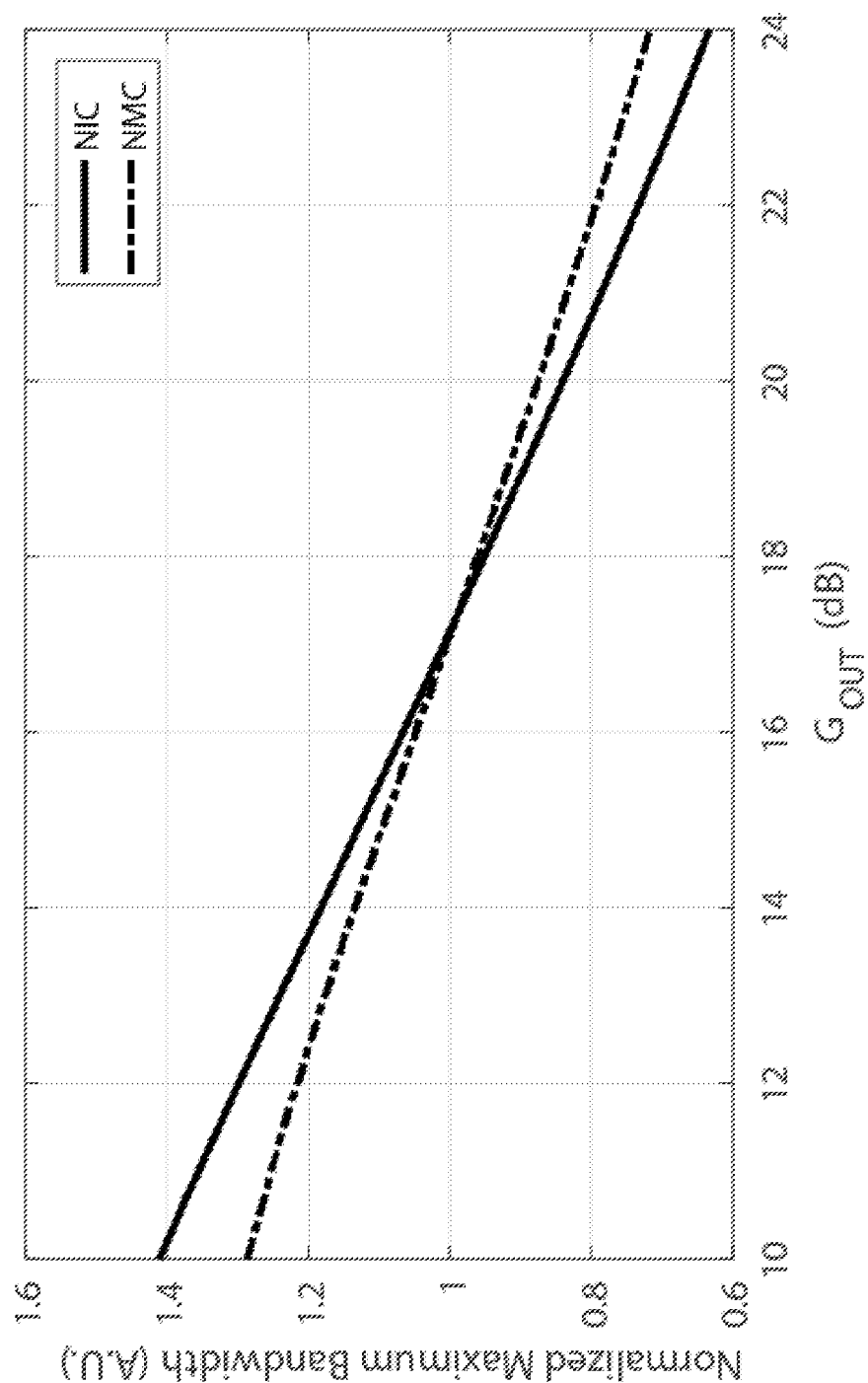
FIG. 2 illustrates achievable bandwidths of the amplifier of FIG. 1 (NIC approach) in comparison to a comparable amplifier without negative impedance converter NIC.

$\frac{C_{NMC} - C_{DC}}{g_m} b_1 = (C_{NMC} + C_{BC})(r_e + R_{GAIN}) +$ $\qquad Ar_e(C_{BC} - C_{NMC}) + C_{BE} r_e b_2 =$ $\qquad (C_{NMC} C_{BE} + C_{BE} C_{BC} + 4 C_{NMC} C_{BC}) r_e R_{GAIN}$ FIG. 2 shows (based on equations (3) and (4)) the maximum achievable bandwidths of the amplifier 10 of FIG. 1 (with NIC approach) in comparison to a comparable amplifier without negative impedance converter NIC but based on the NMC-approach. It is visible that the NIC approach is advantageous over the NMC approach below a certain gain. To explain this let us simplify further the previous equations, neglecting the influence of the gain resistance and of the base inductance and considering that the zero determined by coefficient a1 is typically at very high frequency:

$$G_{OUT,NIC}(s) = -A \frac{1 + \frac{s}{m\omega_0}}{1 + \frac{s}{\omega_0} + \frac{s^2}{m\omega_0^2}} \quad (5)$$

By equation (5), the maximum bandwidth is obtained when $m=\sqrt{2}$:

$$f_{BW,NIC} = \frac{1.85}{2\pi r_e C_{LOAD}}, \quad C_{LOAD} = C_{BE} + (1+A)C_{BC} \quad (6)$$

The frequency response without the negative impedance converter NIC can be approximated as:

$$G_{OUT,NMC}(s) = \frac{1}{1 + sr_e[C_{LOAD} + (1-A)C_{NMC}]}, \quad (7)$$

If we impose that $C_{NMC}=C_{BC}$, the resulting bandwidth will be:

$$f_{BW,NMC} = \frac{1}{2\pi r_e [C_{BE} + 2C_{BC}]} \quad (8)$$

We can now compare equations (6) and (8) to understand when the negative impedance converter NIC provides a larger bandwidth:

$$f_{BW,NIC} \geq f_{BW,NMC} \rightarrow A \leq 2.7 + 0.85 \frac{C_{BE}}{C_{BC}} \quad (9)$$

In the former example $C_{BE}=5.5\,C_{BC}$ so that the negative impedance converter NIC will perform better than the NMC approach when A≤17.3 dB. Since single-stage gain in high-speed circuits never exceeds 20 dB, we can conclude that the NIC approach is generally more advantageous than the NMC approach. Indeed, when also the load capacitance at the gain node is considered, the threshold gain will move to higher values.

Figures 3, 4:
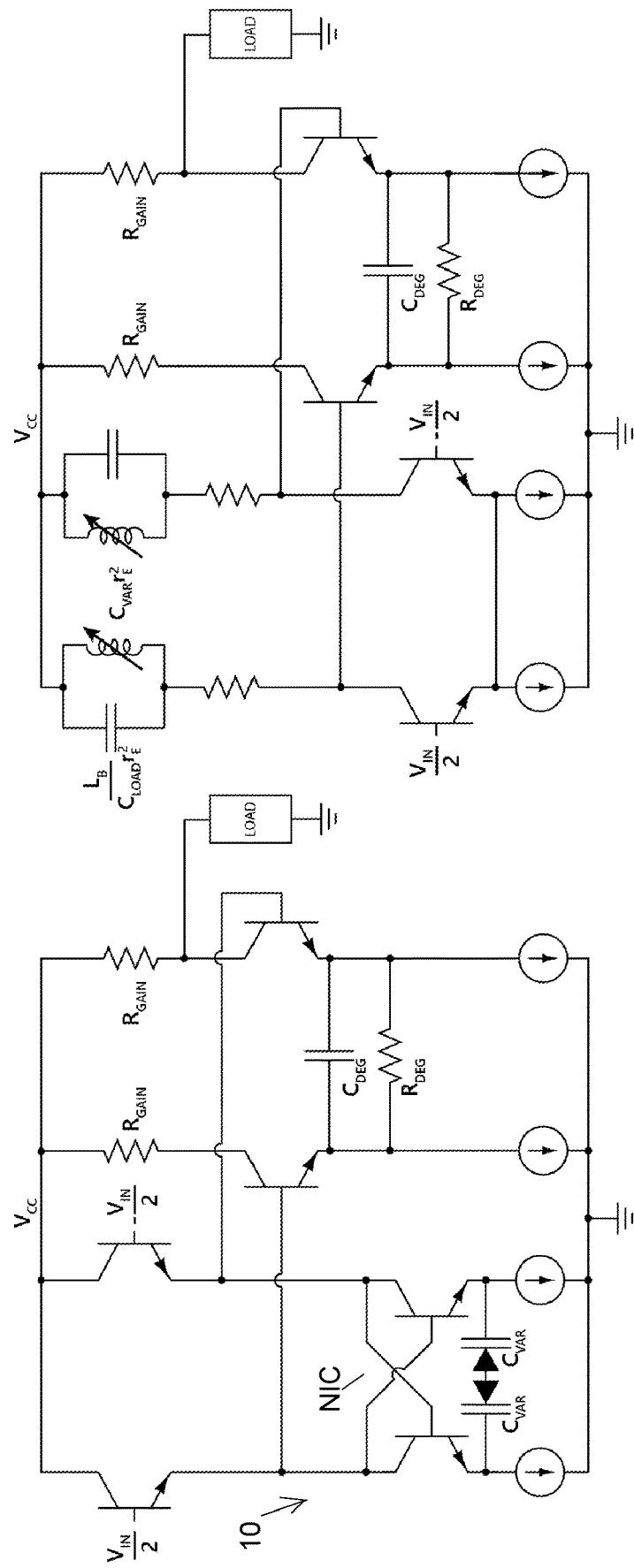
FIG. 3 illustrates a second exemplary embodiment of an amplifier and a device according to the present invention.
FIG. 4 illustrates the equivalent circuit of the second exemplary embodiment.

FIG. 3 depicts a second exemplary embodiment of an amplifier 10 according to the present invention. In this embodiment, two variable capacitors $C_{VAR}$ replace the two fixed capacitors $C_{NIC}$ of FIG. 1. The variable capacitors $C_{VAR}$ provide a variable inductor. The equivalent circuit is shown in FIG. 4. The implementation of a variable inductor would not be feasible with the NMC approach, indeed the well capacitance would strongly influence the output bandwidth, while in the NIC approach, by taking advantage of the differential nature of the circuit, the well capacitance is absorbed by the virtual ground. A variable capacitor might serve to modify the frequency behaviour of the circuit. Indeed, when choosing $m=\sqrt{2}$, a Butterworth filter shape is obtained, but other shapes (i.e. Bessel) or other frequency behaviors are possible as well.

FIG. 5 depicts a third exemplary embodiment of an amplifier 10 according to the present invention. The embodiment of FIG. 5 comprises two additional resistors $R_B$. The emitter of the first transistor T1 is connected to the base of the fourth transistor T4 via a first one of the resistors $R_B$ and the emitter of the second transistor T2 is connected to the base of the third transistor T3 via a second one of the resistors $R_B$.

In order to achieve a flatter gain with less pronounced peaking, it is possible to adjust the value of kB. This can be achieved by introducing the resistors $R_B$ in series with the base of transistors T3 and T4, so that $L_B=\tau_B\cdot(r_B+R_B)$, as shown in the equivalent circuit that is depicted in FIG. 6.

Figure 7:
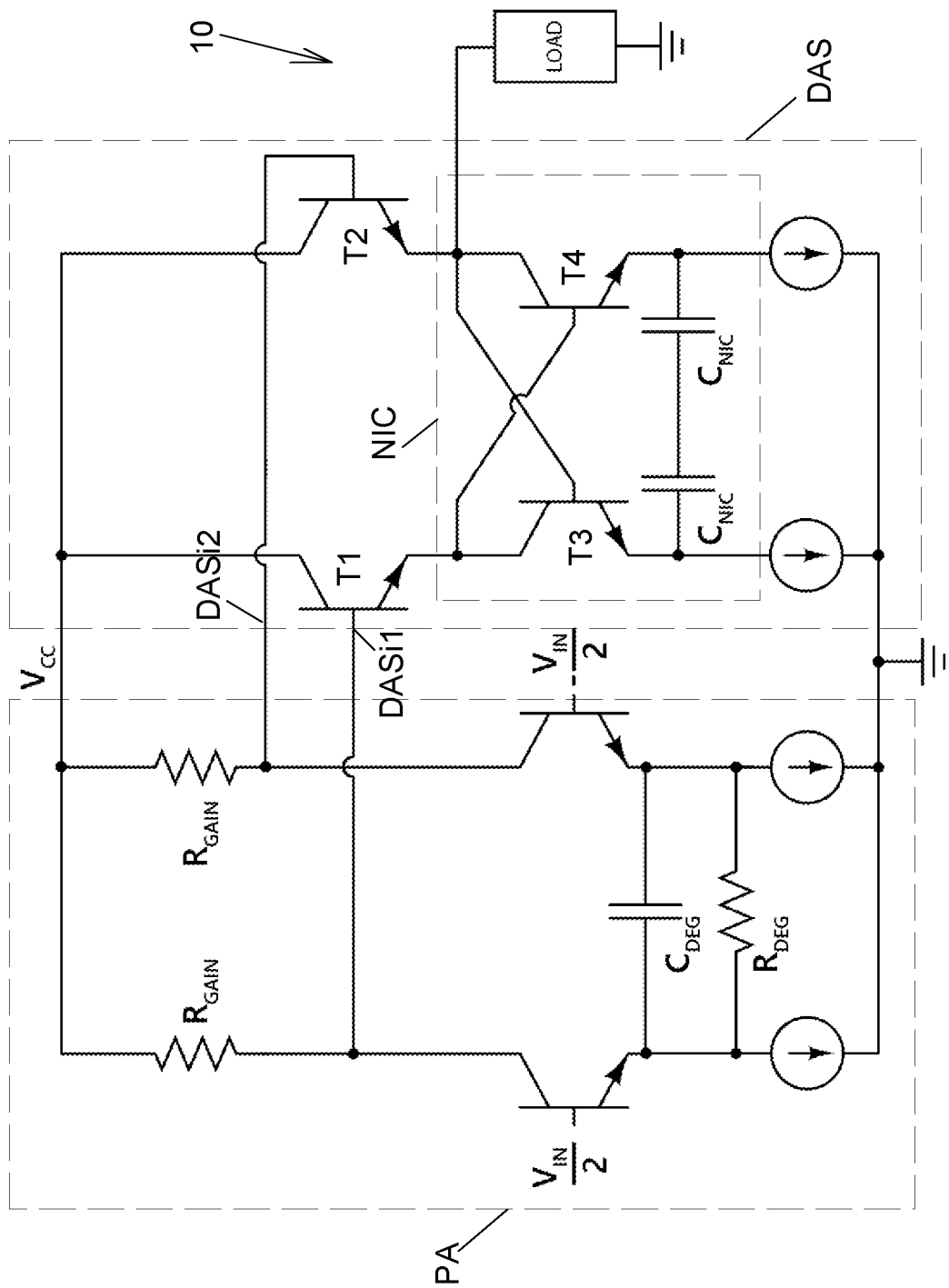
FIG. 7 illustrates a fourth exemplary embodiment of an amplifier and a device according to the present invention.

FIG. 7 depicts a fourth exemplary embodiment of an amplifier 10 according to the present invention. Here, the negative impedance converter NIC is electrically located in the downstream amplifier stage DAS and applies the negative capacitance to the downstream amplifier stage DAS.

The downstream amplifier stage DAS comprises a first and a second transistor T1 and T2. The base of the first transistor T1 forms a first input port DASi1 of the downstream amplifier stage DAS; and the base of the second transistor T2 forms a second input port DASi2 of the downstream amplifier stage DAS. The emitter of one of the second transistors, here transistor T2, provides an output port of the downstream amplifier to which a load LOAD is connected.

The negative impedance converter NIC couples the emitters of the first and second transistor T1 and T2 of the downstream amplifier stage DAS and applies a negative capacitance thereto.

The negative impedance converter NIC is formed by a third transistor T3, a fourth transistor T4 and a stacked capacitor formed by two capacitors $C_{NIC}$ arranged in series. The collector of the third transistor T3 is connected to the base of the fourth transistor T4. The collector of the fourth transistor T4 is connected to the base of the third transistor T3. The two capacitors $C_{NIC}$ connect the emitters of the third transistor T3 and the fourth transistor T4.

In the embodiment of FIG. 7, the emitter of the first transistor T1 is connected to both the collector of the third transistor T3 and the base of the fourth transistor T4. The emitter of the second transistor T2 is connected to both the collector of the fourth transistor T4 and the base of the third transistor T3.

The embodiment of FIG. 7 allows to increase the bandwidth of a downstream modulator that is connected as load LOAD to the amplifier 10, as well. Indeed, the NIC approach is advantageous in those circuits driving heavy load optical devices that are based on an electro-optical effect such as injection modulators, EAM, etc . . . , since it may provide a low impedance driving circuit and an emitter follower. As mentioned above, the introduction of the NIC stage occurs without power penalty.

This, in turn, implies a reduction of the de-emphasis with a subsequent boost of the electro-optical effect. Indeed, for the circuit of FIG. 7 without NIC stage, we can write:

$$G_{OUT}(s) = \frac{-g_m R_{GAIN}}{1 + \frac{g_m R_{DEG}}{2}} \frac{(1 + sR_{DEG}C_{DEG})}{\left[1 + sR_{DEG}C_{DEG}\left(1 + \frac{g_m R_{DEG}}{2}\right)^{-1}\right]}$$
$$(1 + sR_{GAIN}C_{GAIN})(1 + sr_e C_{LOAD}) \quad (10)$$

So if we want the zero to compensate the pole introduced by the load $R_{DEG}\,C_{DEG}=r_e\,C_{LOAD}$, the bandwidth will be extended by a factor $1+g_m R_{DEG}/2$, but the gain will be decreased by the same factor. Therefore, either the electro-optical effect is reduced, or the voltage swing must be increased, thus requiring higher currents or higher gain resistance, which in turn may again decrease the bandwidth.

For the circuit of FIG. 7 with NIC stage, neglecting the inductive component, we can express the frequency response as:

$$G_{OUT,NIC}(s) = G_{OUT}(s) \frac{1 + \frac{s}{m\omega_0}}{1 + \frac{s}{\omega_0} + \frac{s^2}{m\omega_0^2}}, \quad \omega_0 = r_e C_{LOAD} \quad (11)$$

Since the maximum bandwidth $1.85\omega_0$ is obtained when $m=\sqrt{2}$, we can simplify (11) in:

$$G_{OUT,NIC}(s) = \frac{-g_m R_{GAIN}}{1 + \frac{g_m R_{DEG}}{2}} \frac{(1 + sR_{DEG}C_{DEG})}{\left[1 + sR_{DEG}C_{DEG}\left(1 + \frac{g_m R_{DEG}}{2}\right)^{-1}\right]} \quad (12)$$

$$(1 + sR_{GAIN}C_{GAIN})(1 + sr_{e4}C_{OUT}/1.85)$$

Equation (12) shows that the zero introduced by the capacitive degeneration must compensate a 1.85 times smaller time constant. This implies that given an equal $C_{DEG}$, the NIC approach will require a degeneration resistance 1.85 times smaller, corresponding to 5.3 dB larger (see FIG. 8).

Figure 8:
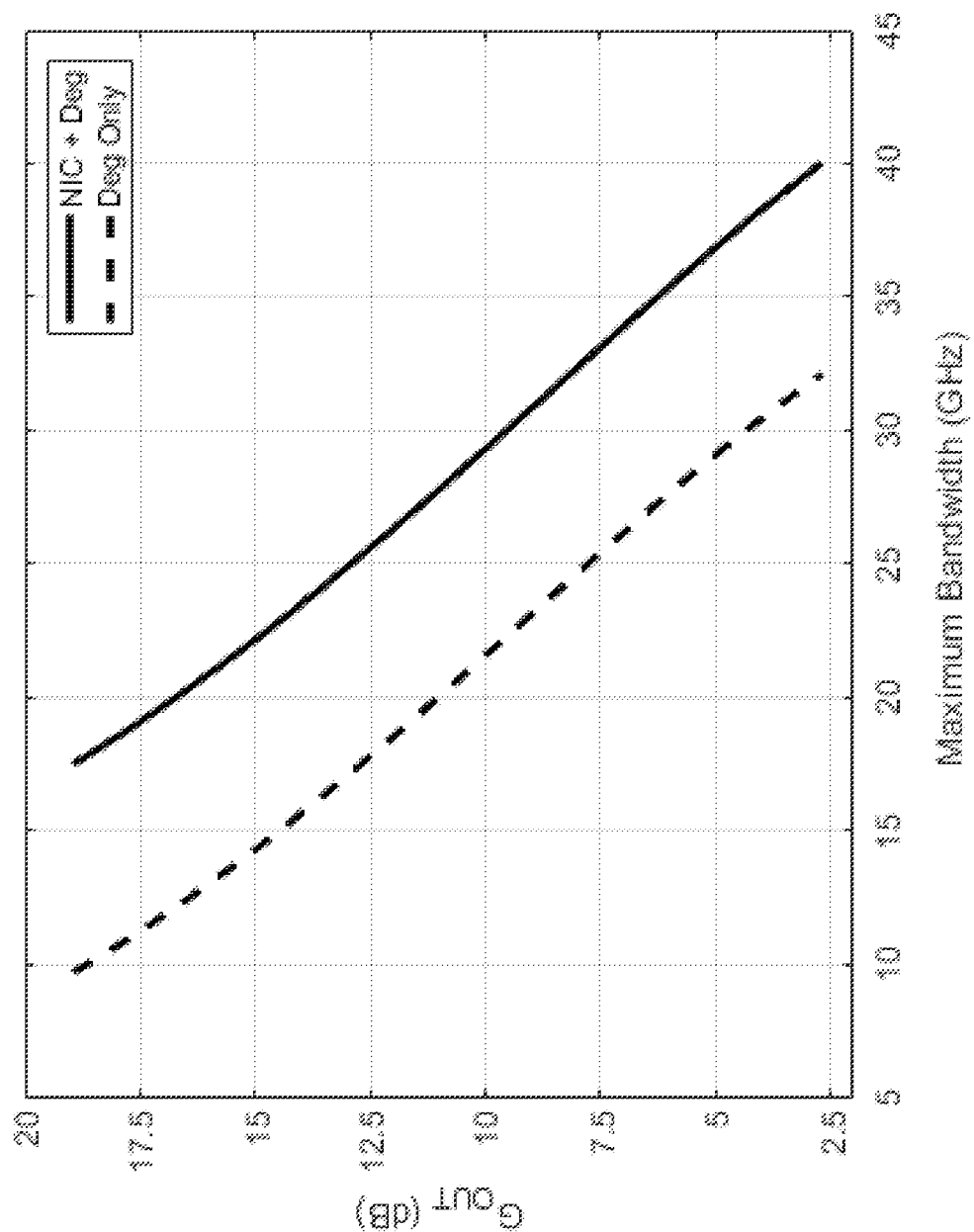
FIG. 8 shows the gain dependency of the fourth embodiment over the maximum bandwidth with and without negative impedance converter NIC.

FIG. 8 shows GOUT over the maximum bandwidth with and without negative impedance converter NIC.

Figure 9:
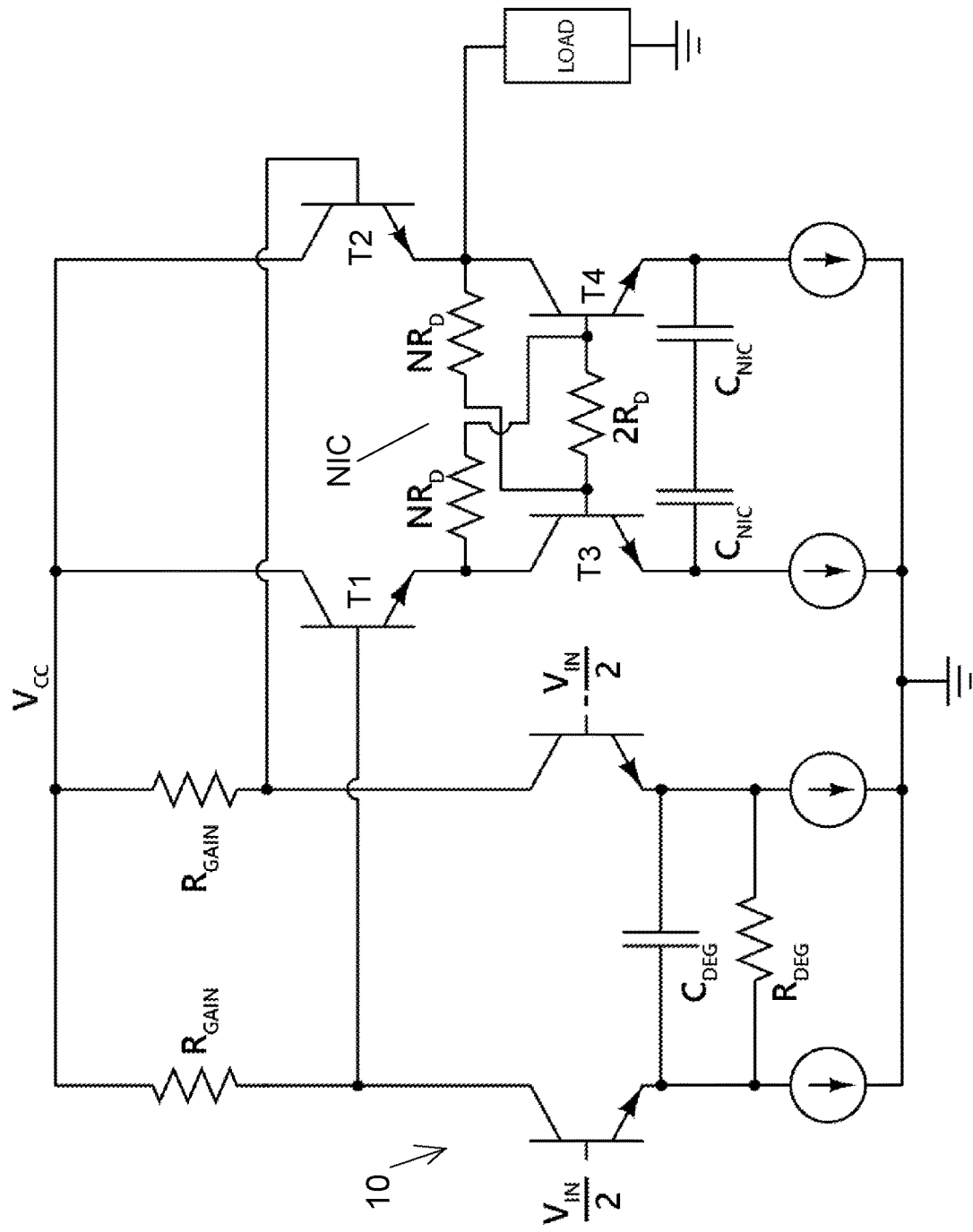
FIG. 9 illustrates a fifth exemplary embodiment of an amplifier and a device according to the present invention.

FIG. 9 depicts a fifth exemplary embodiment of an amplifier 10 according to the present invention. The negative impedance converter NIC of this embodiment comprises two resistors with a value of $N \cdot R_D$ and a third resistor with a value of $2 \cdot RD$.

The emitter of the first transistor T1 is connected to the base of the fourth transistor T4 via one of the resistors $NR_D$; and the emitter of the second transistor T2 is connected to the base of the third transistor T3 via the other one of the resistors $NR_D$. The bases of the third and fourth transistor T3 and T4 are connected via the third resistor 2RD.

In the embodiment of FIG. 9, it is possible to use the resistive divider in order to decrease the voltage swing across the collect-base of the abovementioned pair, since the output voltage swing may be large enough to cause the saturation of the cross-coupled pair. The resistors are arranged in a way the DC levels are the same as in the embodiment of FIG. 7, but in AC operations the voltage on the cross-coupled pair is reduced by a factor (N+1). The validity of Equations (1)-(11) holds as long as the size of transistors T3 and T4 is (N+1) times larger than the size of the transistors T1 and T2 and if $N \cdot R_D \gg r_{e4}$. It must be noted that the maximum bandwidth will be achieved when $$C_{NIC} = C_{LOAD}/[\sqrt{2}(N+1)].$$

$$C_{NIC} = C_{LOAD}/[\sqrt{2(N+1)}].$$

Figure 10:
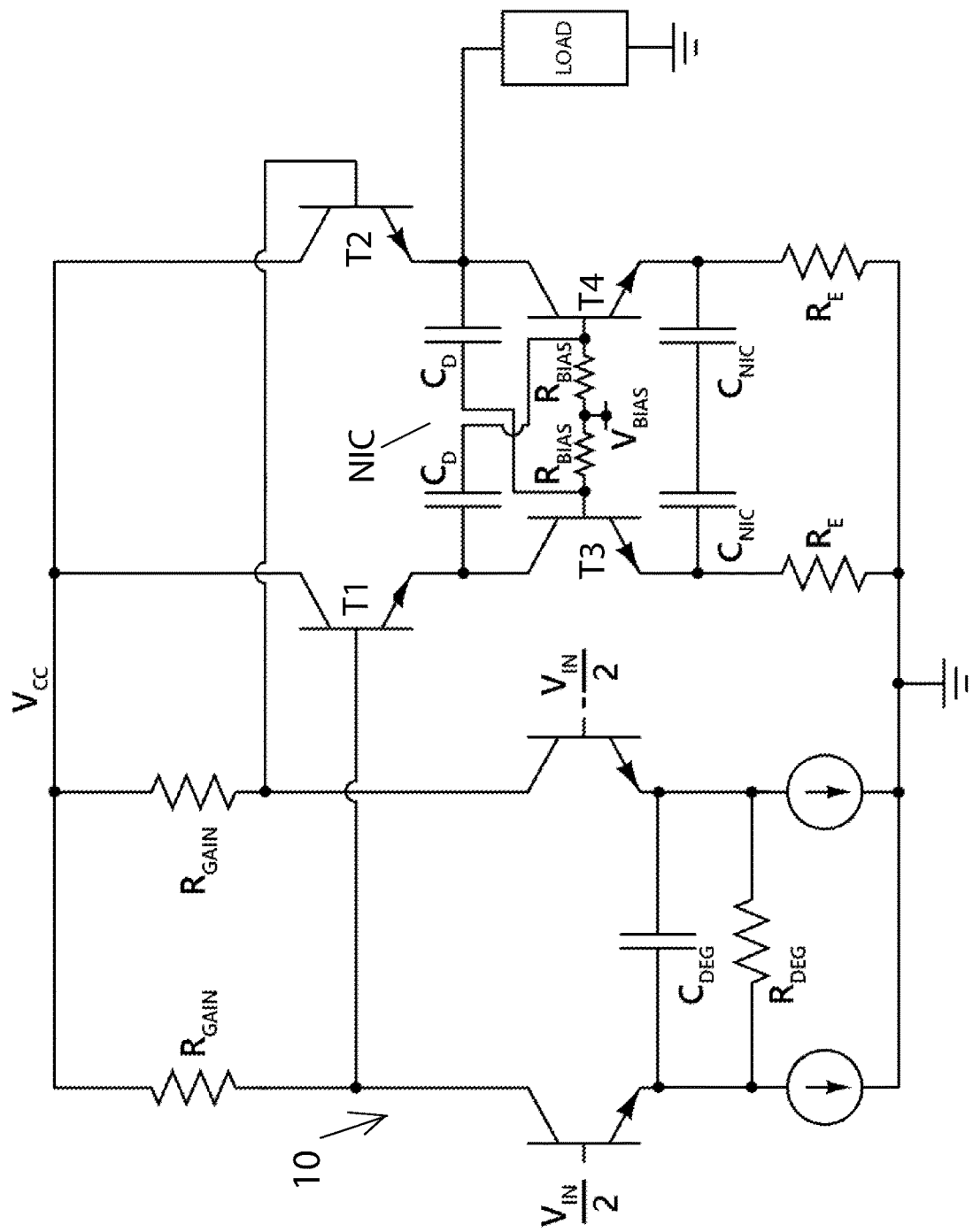
FIG. 10 illustrates a sixth exemplary embodiment of an amplifier and a device according to the present invention.

FIG. 10 depicts a sixth exemplary embodiment of an amplifier 10 according to the present invention. Here, the emitter of the first transistor T1 is connected to the base of the fourth transistor T4 via a first auxiliary capacitor $C_D$. The emitter of the second transistor T2 is connected to the base of the third transistor T3 via a second auxiliary capacitor $C_D$.

Further, the bases of the third and fourth transistor T3 and T4 are connected via two resistances $R_{BIAS}$. The resistances $R_{BIAS}$ are connected in series. The midpoint between the resistances $R_{BIAS}$ is connected to a voltage source that determines the current in the third transistor T3 and the fourth transistor T4.

Further, the emitters of the third transistor T3 and the fourth transistor T4 are grounded via resistors $R_E$ instead of current sources.

If $R_E \gg 1/(s \cdot C_{NIC})$ in the frequency range of interest, than the scaling factor will be $N = C_B/C_D$.

The validity of Equations (1)-(11) holds as long as the size of transistors T3 and T4 is (N+1) times larger than the size of transistors T1 and T2. The maximum bandwidth will be achieved when $C_{NIC} = C_{LOAD}/[\sqrt{2}(N+1)]$.

$$C_{NIC} = C_{LOAD}/[\sqrt{2(N+1)}].$$

Figure 11:
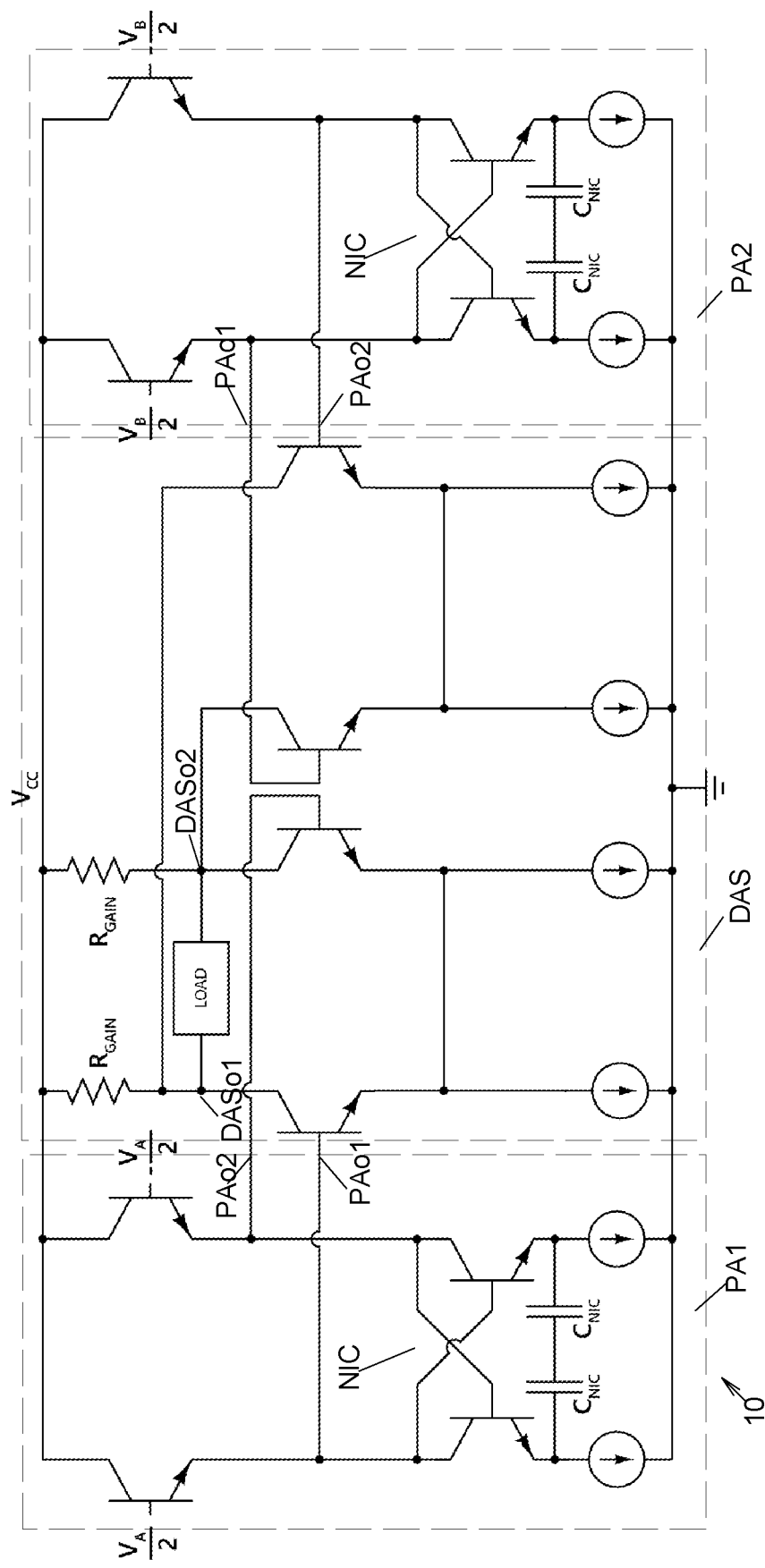
FIG. 11 illustrates a seventh exemplary embodiment of an amplifier and a device according to the present invention.

FIG. 11 depicts a seventh exemplary embodiment of an amplifier 10 according to the present invention. In this embodiment, the amplifier comprises two differential preamplifiers PA1 and PA2. The two differential preamplifiers PA1 and PA2 are provided with differential input signals $V_A$ and $V_B$.

A negative impedance converter NIC is located in each of the differential preamplifiers PA1 and PA2. Each of the negative impedance converters NIC applies its negative capacitance to both output ports PAo1 and PAo2 of the allocated differential preamplifier PA1 or PA2.

The load LOAD is connected between the output ports DASo1 and DASo2 of the downstream amplifier stage DAS.

In the embodiment of FIG. 11, an FFE circuit is integrated for further bandwidth extension. Indeed, in a typical FFE circuit two or more differential pairs are connected to the same output node. To increase the speed, it is not possible here to use the NMC approach given that two or more different signals would act on the cross-connected capacitors, therefore either inductive peaking or a cascode stage is used. The latter approach requires larger power supply given the transistor stack, or a decrease of the voltage swing.

In the embodiments discussed above with reference to FIGS. 1-11, co-integration of amplifier (driver) and an electro-optical modulator would result in the best speed enhancement, given the absence of additional parasitic elements such as pad/wire stray capacitance and inductance at the output node.

In the embodiments discussed above with reference to FIGS. 1-11, all the circuits can be implemented in all kinds of technologies (CMOS, BJT, etc . . . ).

In the embodiments discussed above with reference to FIGS. 1-11, the load LOAD can be connected to only one output (single-ended configuration) or to both (differentially) when possible (i.e. push-pull modulator).

The principles of operation described above by way of example may be applied to any type of devices that include amplifiers and optical modulators (e.g. phase modulators, amplitude modulators, polarization modulators, injection modulators, depletion modulators, etc. . . . ).

Co-integration of the amplifiers (drivers) and the electro-optical modulators may usually offer the best performance, given the absence of additional parasitic elements such as pad/wire stray capacitance and inductance that would otherwise degrade the RF signal on the modulator electrode and disturb the propagation delay on the high-speed connection to the delay compensation loop circuit.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the world "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims as well as with any other (one or more) of the present dependent claims (regardless of the present claim structure). Therefore, the applicant may direct further patent claims towards other claim combinations at a later stage of the prosecution.

For instance, the devices of claims 25 and 26 may comprise the features of any of claims 2-24 (in any combination).

Further, the amplifier of claim 1 may comprise the features of any, multiple or all of the dependent claims 2-24. In other words each of the dependent claims may refer to any other dependent claim regardless of the current claim structure and the order in which the dependent claims are listed below.

LIST OF FORMULA SYMBOLS $\tau_B$ base transit time
$r_B$ base resistance
$r_e$ small signal emitter resistance
$g_m$ transistor transconductance
$C_{LOAD}$ equivalent load capacitance of the downstream amplifier stage
$C_{BE}$ small signal base-emitter capacitance
$C_{BC}$ small signal base-collector capacitance
$C_{DEG}$ differential pair emitter degeneration capacitance
$C_{GAIN}$ gain stage collector parasitic capacitance
$C_{OUT}$ equivalent output load capacitance
$C_{NMC}$ cross-coupled base-collector capacitance for miller effect compensation (negative miller capacitance)
$C_{NIC}$ equivalent negative impedance converter emitter capacitance
$R_{GAIN}$ gain stage collector resistance
$R_{DEG}$ differential pair emitter degeneration resistance

The invention claimed is:

1. Electrical amplifier comprising,
a differential preamplifier having a first output port and a second output port; and
a downstream amplifier stage having a first output unit and a second output unit;
wherein the first output unit is connected to the first output port of the differential preamplifier and the second output unit is connected to the second output port of the differential preamplifier; and
wherein a negative impedance converter is electrically located in at least one of said differential preamplifier and said downstream amplifier stage; and
wherein the negative impedance converter is configured to provide a negative capacitance; and
wherein the negative impedance converter is electrically located in the differential preamplifier and applies the negative capacitance to the first output port and the second output port of the differential preamplifier.

2. Electrical amplifier of claim 1,
wherein the differential preamplifier comprises a first and a second transistor;
wherein the emitter of the first transistor provides the first output port of the differential preamplifier;
wherein the emitter of the second transistor provides the second output port of the differential preamplifier; and
wherein the negative impedance converter applies the negative capacitance to the emitters of the first and second transistor.

3. Electrical amplifier of claim 2,
wherein the collector of a third transistor is connected to the base of a fourth transistor;
wherein the collector of the fourth transistor is connected to the base of the third transistor;
wherein at least one capacitor connects the emitters of the third transistor and fourth transistor; and
wherein the third transistor, the fourth transistor and the at least one capacitor form or are at least part of said negative impedance converter.

4. Electrical amplifier of claim 3,
wherein the emitter of the first transistor is connected to both the collector of the third transistor and the base of the fourth transistor; and
wherein the emitter of the second transistor is connected to both the collector of the fourth transistor and the base of the third transistor.

5. Electrical amplifier of claim 4,
wherein the base of the first transistor forms a first input port of the differential preamplifier; and
wherein the base of the second transistor forms a second input port of the differential preamplifier.

6. Electrical amplifier of claim 3,
wherein the emitters of the third transistor and fourth transistor are connected by a first capacitor and a second capacitor; and
wherein the first and the second capacitor are connected in series.

7. Electrical amplifier of claim 5, wherein the first and the second capacitor are variable.

8. Electrical amplifier of claim 7,
wherein the emitter of the first transistor is connected to the base of the fourth transistor via a first resistance; and
wherein the emitter of the second transistor is connected to the base of the third transistor via a second resistance.

9. Electrical amplifier comprising,
a differential preamplifier having a first output port and a second output port; and
a downstream amplifier stage having a first output unit and a second output unit;
wherein the first output unit is connected to the first output port of the differential preamplifier and the second output unit is connected to the second output port of the differential preamplifier; and
wherein a negative impedance converter is electrically located in at least one of said differential preamplifier and said downstream amplifier stage; and
wherein the amplifier comprises at least two differential preamplifiers;
wherein a negative impedance converter is located in both of said at least two differential preamplifiers;
wherein the amplifier comprises at least two downstream amplifier stages;

wherein one of said at least two downstream amplifier stages is connected to one of said at least two differential preamplifiers;

wherein the other one of said at least two downstream amplifier stages is connected to the other one of said at least two differential preamplifiers; and wherein the at least two downstream amplifier stages are connected to the same load.

10. Electrical amplifier of claim 9, wherein the negative impedance converters are each configured to provide a negative capacitance; and wherein each of the negative impedance converters applies its negative capacitance to both output ports of the allocated differential preamplifier.

11. Electrical amplifier of claim 1, wherein the amplifier comprises an output port for driving a load in single-ended configuration.

12. Electrical amplifier of claim 1, wherein the amplifier comprises two output ports for driving a load differentially.

13. Device comprising at least one electrical amplifier according to claim 1, and at least one modulator that is driven by said amplifier.

14. Device of claim 13, wherein the amplifier drives the modulator in a push-pull mode.

15. Electrical amplifier of claim 9, wherein the amplifier comprises an output port for driving a load in single-ended configuration.

16. Electrical amplifier of claim 9, wherein the amplifier comprises two output ports for driving a load differentially.

* * * * *